United States Patent
Wen et al.

(10) Patent No.: US 11,091,094 B2
(45) Date of Patent: Aug. 17, 2021

(54) CAPACITIVE SENSING CAR-DOOR PRE-OPENING WARNING DEVICE BASED ON A FLEXIBLE PRINTED CIRCUIT

(71) Applicant: GLORY CREATIVE, INC., Taipei (TW)

(72) Inventors: Chia-Wen Wen, Taipei (TW); Ju-Lin Wen, Kaohsiung (TW)

(73) Assignee: GLORY CREATIVE, INC., Taipei (TW)

( * ) Notice: Subject to any disclaimer, the term of this patent is extended or adjusted under 35 U.S.C. 154(b) by 0 days.

(21) Appl. No.: 16/976,498

(22) PCT Filed: May 15, 2018

(86) PCT No.: PCT/CN2018/086920
§ 371 (c)(1),
(2) Date: Aug. 28, 2020

(87) PCT Pub. No.: WO2019/218165
PCT Pub. Date: Nov. 21, 2019

(65) Prior Publication Data
US 2021/0046868 A1   Feb. 18, 2021

(51) Int. Cl.
*B60Q 9/00* (2006.01)
*B60Q 3/16* (2017.01)
*B60Q 3/14* (2017.01)
*B60Q 3/82* (2017.01)
*H05K 1/18* (2006.01)
*G01R 27/26* (2006.01)
*H03K 17/96* (2006.01)

(52) U.S. Cl.
CPC ........... *B60Q 9/00* (2013.01); *G01R 27/2605* (2013.01); *H03K 17/962* (2013.01); *H05K 1/189* (2013.01)

(58) Field of Classification Search
CPC ........................................ B60Q 9/00
See application file for complete search history.

(56) References Cited

U.S. PATENT DOCUMENTS

| | | | |
|---|---|---|---|
| 2002/0152582 A1* | 10/2002 | Sueyoshi | H03K 17/962 16/412 |
| 2018/0252005 A1* | 9/2018 | Magner | E05B 47/0657 |
| 2019/0040660 A1* | 2/2019 | Gabriel | E05B 81/78 |
| 2019/0169893 A1* | 6/2019 | Scheiern | E05B 85/16 |

* cited by examiner

*Primary Examiner* — Joseph H Feild
*Assistant Examiner* — Pameshanand Mahase

(57) ABSTRACT

A capacitive sensing car-door pre-opening warning device based on a flexible printed circuit in the present application comprises an inside door handle trim panel, an inside door handle subassembly, a flexible printed circuit, a capacitive sensing element, a capacitive-sensing processing circuit, a warning unit and a control unit wherein: the inside door handle trim panel is designed to have a through hole as well as an accommodating space; the inside door handle subassembly has a portion penetrating the through hole and linking the car door linkage and another portion covered in the accommodating space which is sensed by the capacitive sensing element; the capacitive-sensing processing circuit generates a sensing capacitance after processing for development of a warning instruction from the control unit and activation of a warning mode configured in the control unit according to the warning instruction.

9 Claims, 3 Drawing Sheets

CAPACITIVE SENSING CAR-DOOR PRE-OPENING WARNING DEVICE BASED ON A FLEXIBLE PRINTED CIRCUIT

BACKGROUND OF THE INVENTION

Field of the Invention

The present application relates to a vehicle warning device, particularly a capacitive sensing car-door pre-opening warning device based on a flexible printed circuit.

Description of the Prior Art

Amid traffic accidents, a car door unexpectedly opened by a car driver or a passenger who pays no attention to traffic conditions nearby and directly hit by a vehicle or a pedestrian approaching from behind and responding too late often takes place.

For prevention of the safety problem, a car door safety warning device (TW M509150), a car door opening safety warning device (TW M510875), a car door warning system (TW M522149), a car door opening voice reminder device (TW M524280), a safety voice reminder sensor device (TW M529620), a carborne warning device (TW M530762), a car door opening warning device (CN202782885U), a car door opening warning structure (TW M523614), etc., as shown in the prior art, are characteristic of push buttons or infrared, ultrasonic or passive infrared (PIR) sensors mounted on inside door handles to sense an action of a car door opened by a car user and generate warning signals for the user.

However, there are lots of restrictions existing in realistic applications of the above techniques. For example, because an inside door handle on which push buttons are installed is opened and closed frequently, a gap between two push buttons is usually stuffed with foreign objects which often disables or even deactivates push buttons.

In most IR or ultrasonic-based solutions, a receiver-transmitter unit for sensor signals installed between an inside door handle and an inside door handle trim panel is used to determine a signal interrupted for generation of a warning signal. In these technical solutions, however, a malfunction affecting a user's confidence for a product ensues with a user's hand operating beyond a designated area.

Furthermore, the technical solution based on PIR sensors easily fails in a realistic carborne environment in which temperature approaches or exceeds 37 degrees Celsius or a car user wears gloves that prevent PIR sensors from correctly recognizing a car door being opened by the user.

For prevention of the above problems, a capacitive-touch inside door handle warning device as shown in TW M543807 is developed to determine whether an inside door handle is approached or contacted by a user for generation of a warning signal. In practice, however, the volume in a car door trim panel increases and is inapplicable to all vehicle types if a traditional rigid PCB is not perfectly adhere to an inside door handle trim panel with a curved shape in design mostly. Moreover, a mistake is made by a warning device which is interfered by lots of electronic signals causing poor sensing inside a moving vehicle.

In summary, the designs of existing car-door pre-opening warning devices need to be corrected.

SUMMARY OF THE INVENTION

In virtue of problems in the prior art, a capacitive sensing car-door pre-opening warning device based on a flexible printed circuit in the present application depends on a flexible printed circuit designed in the device for accurate sensing of a car-door pre-opening warning device.

To this end, a capacitive sensing car-door pre-opening warning device based on a flexible printed circuit in the present application comprises an inside door handle trim panel, an inside door handle subassembly, a flexible printed circuit, a capacitive sensing element, a capacitive-sensing processing circuit, a warning unit and a control unit wherein: the inside door handle trim panel is mounted on the inner side of a car door opposite to a car door linkage of the automobile and designed to have a through hole as well as an accommodating space; the inside door handle subassembly has a portion penetrating the through hole and linking the car door linkage and another portion covered in the accommodating space; the flexible printed circuit designed to be a flexible printed circuit (FPC) has a surface, which is mounted on one plane of the inside door handle trim panel opposite to the interior of the car door and/or installed on one plane of the inside door handle trim panel opposite to the accommodating space, and another surface on which the capacitive sensing element, the capacitive-sensing processing circuit and the control unit are mounted wherein the control unit is also installed inside an automobile. In configuration states of all components, the capacitive sensing element and the capacitive-sensing processing circuit are electrically connected to each other, the control unit is electrically connected with the capacitive-sensing processing circuit and the warning unit, and the capacitive sensing element senses a variation of capacitance in at least the accommodating space for processing and generation of a sensing capacitance by the capacitive-sensing processing circuit. With a warning mode designed, the control unit relies on the received sensing capacitance to enable the warning mode by which the warning unit is activated according to a warning instruction configured in the control unit.

In summary, the present application is characteristic of one or multiple advantages as follows:

1. A capacitive sensing car-door pre-opening warning device based on a flexible printed circuit in the preset application issues a warning to a car user, who is reaching his (her) hand into the accommodating space, and functions as a "car-door pre-opening" warning device for longer response time of a car user and better safety in contrast to a traditional device which activates a warning process with a car door opened.

2. A flexible printed circuit with a printed circuit embedded is a flexible PCB installed in a small space inside a car door trim panel and applicable to inside door handle trim panels of different vehicle types for better universality.

3. A flexible printed circuit with a printed circuit embedded is a flexible PCB adheres to an inside door handle trim panel properly for fewer mistakes attributed to interferences of electronic signals inside an automobile and better accuracy of capacitive sensing.

BRIEF DESCRIPTION OF THE DRAWINGS

The techniques of present invention would be more understandable from the detailed description given herein below and the accompanying figures are provided for better illustration, and thus description and figures are not limitative for present invention, and wherein.

DETAILED DESCRIPTION OF THE INVENTION

Figure 1:
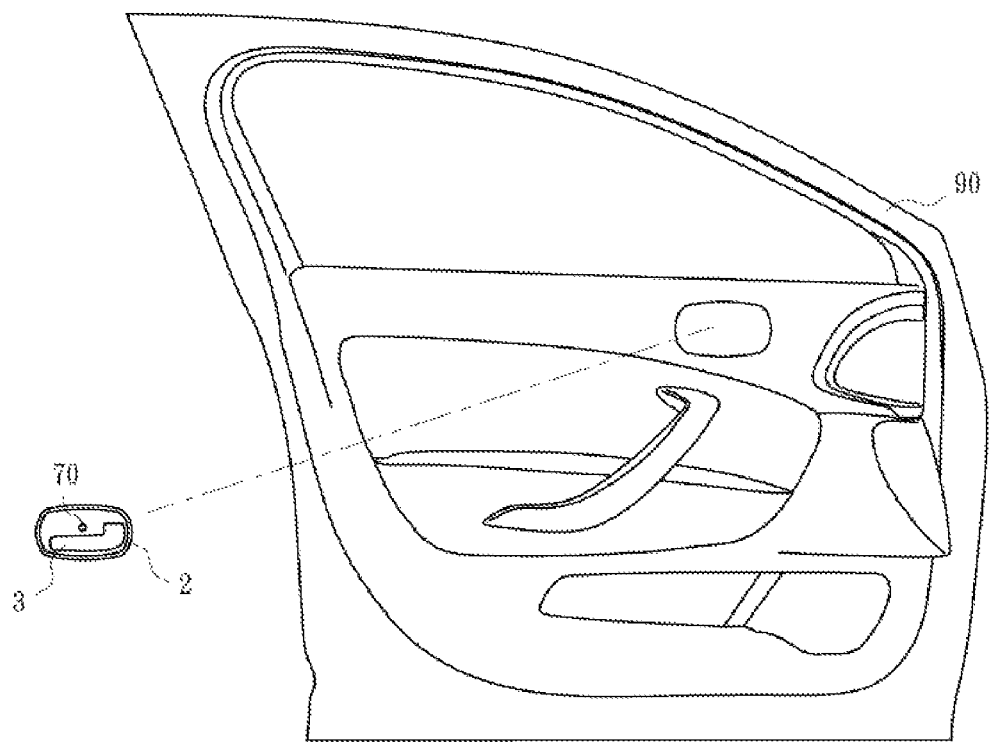
FIG. 1 is a front view of a capacitive sensing car-door pre-opening warning device based on a flexible printed circuit in the present application.
Figure 2:
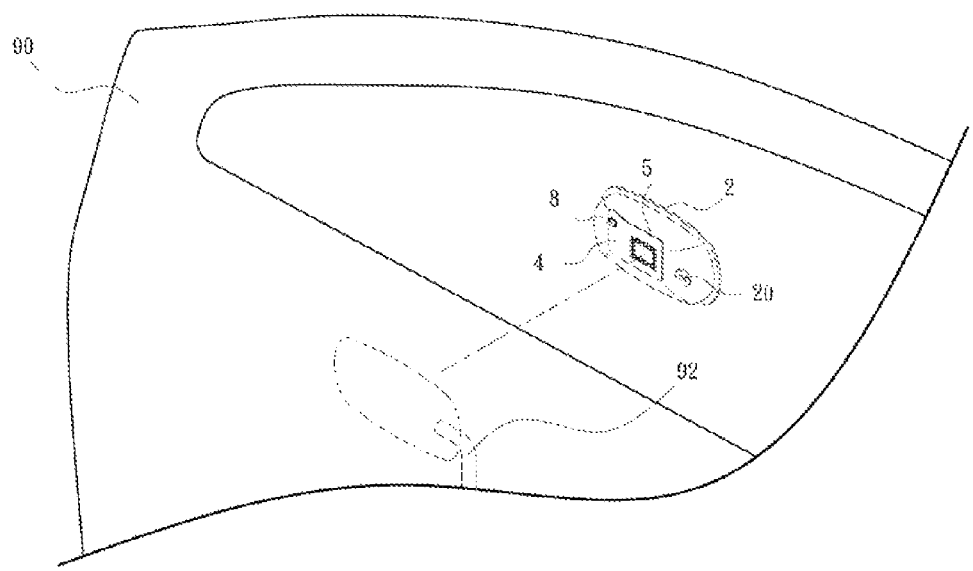
FIG. 2 is a rear view of a capacitive sensing car-door pre-opening warning device based on a flexible printed circuit in the present application.
Figure 3:
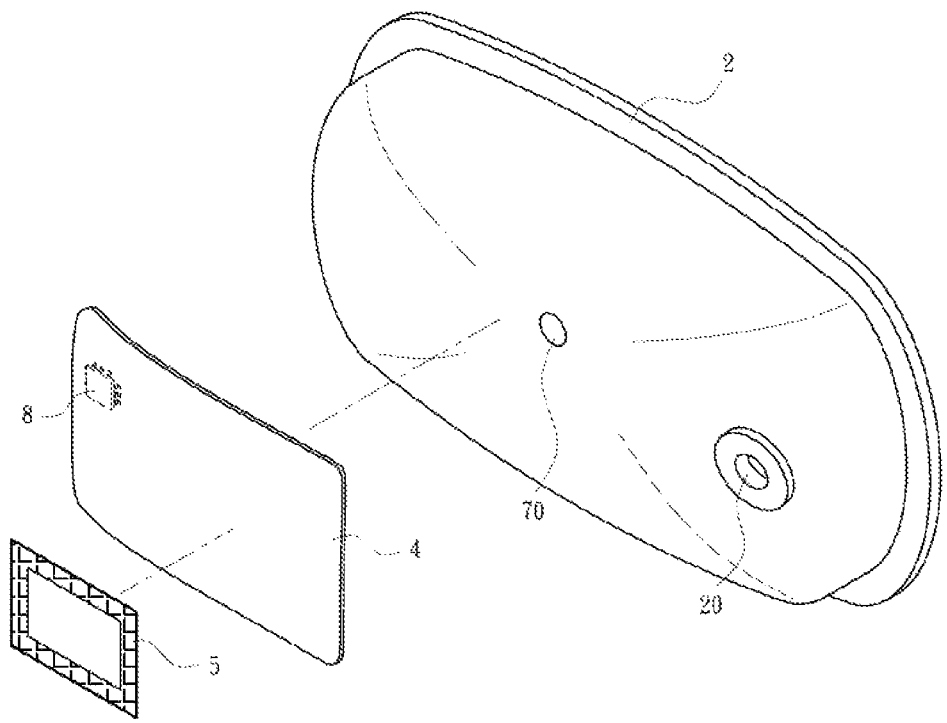
FIG. 3 is an exploded view of a capacitive sensing car-door pre-opening warning device based on a flexible printed circuit as shown in an embodiment of the present application.
Figure 4:
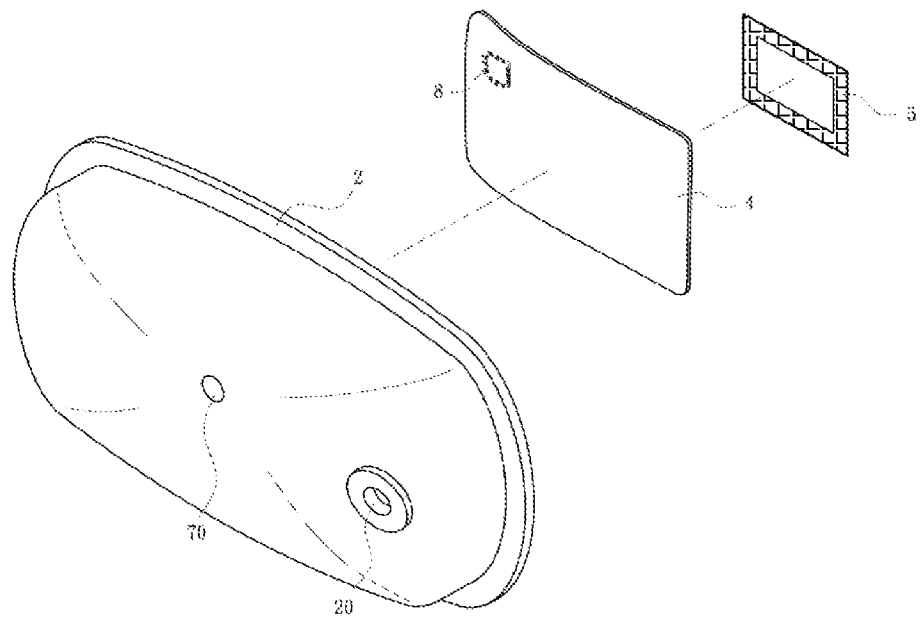
FIG. 4 is an exploded view of a capacitive sensing car-door pre-opening warning device based on a flexible printed circuit as shown in another embodiment of the present application.
Figure 5:
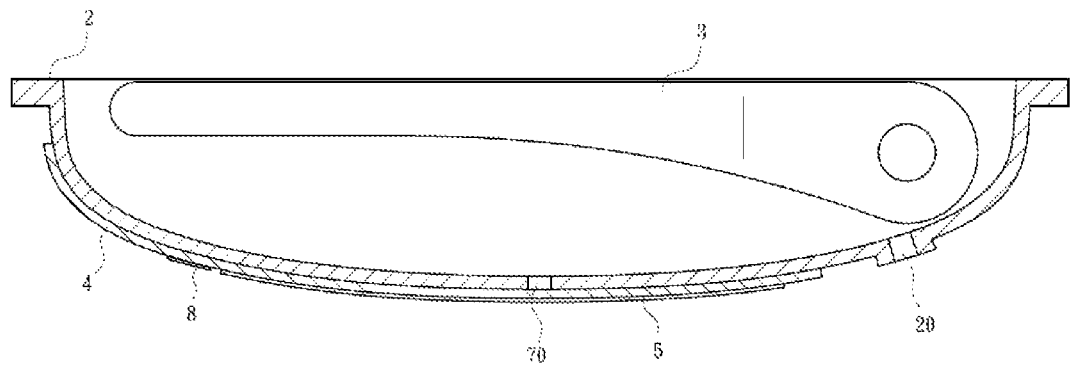
FIG. 5 is a sectional view of a capacitive sensing car-door pre-opening warning device based on a flexible printed circuit in the present application.
Figure 6:
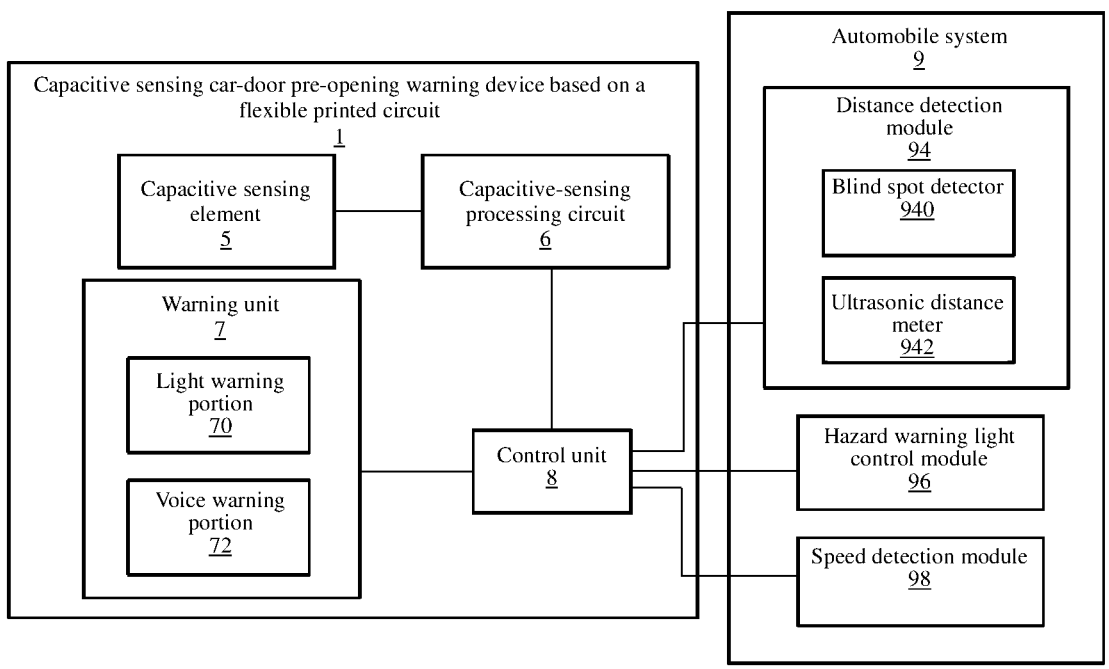
FIG. 6 is a schematic view for architecture of a capacitive sensing car-door pre-opening warning device based on a flexible printed circuit in the present application.

Referring to FIGS. 1 and 2, which illustrate a capacitive sensing car-door pre-opening warning device based on a flexible printed circuit 1 comprises an inside door handle trim panel 2, an inside door handle subassembly 3, a flexible printed circuit 4, a capacitive sensing element 5, a capacitive-sensing processing circuit 6, a warning unit 7 and a control unit 8 in an embodiment of the present application. In the present disclosure, the inside door handle trim panel 2 is mounted on the inner side of a car door 90 opposite to a car door linkage 92 of the automobile and designed to have a through hole 20 as well as an accommodating space; the inside door handle subassembly 3 has a portion penetrating the through hole 20 and linking the car door linkage 92 and another portion covered in the accommodating space. Referring to FIG. 3 to FIG. 5, which illustrate the flexible printed circuit 4 designed to be a flexible printed circuit (FPC) has a surface mounted on one plane of the inside door handle trim panel 2 opposite to the interior of the car door 90 and/or installed on one plane of the inside door handle trim panel 2 opposite to the accommodating space. According to a shape of the inside door handle trim panel 2 designed in a distinct vehicle type, the flexible printed circuit 4 can be flexibly mounted at a position at which a variation of capacitance in the accommodating space is sensed for better universality. The flexible printed circuit 4 is provided with the capacitive sensing element 5, the capacitive-sensing processing circuit 6 and the control unit 8 on the other plane wherein the flexible printed circuit 4, the capacitive sensing element 5 and the capacitive-sensing processing circuit 6 can be formed integrally and the control unit 8 can be installed inside an automobile. Referring to FIG. 6, which illustrates configuration states of all components: the capacitive sensing element 5 and the capacitive-sensing processing circuit 6 are electrically connected to each other; the control unit 8 is electrically connected with the capacitive-sensing processing circuit 6 and the warning unit 7; the capacitive sensing element 5 senses a variation of capacitance in at least the accommodating space for processing and generation of a sensing capacitance by the capacitive-sensing processing circuit 6. With a warning mode designed, the control unit 8 relies on the received sensing capacitance to enable the warning mode by which the warning unit 7 is activated according to a warning instruction configured in the control unit 8.

In the present disclosure, the capacitive sensing car-door pre-opening warning device based on a flexible printed circuit 1 is characteristic of the flexible printed circuit 2 in which a flexible printed circuit is embedded. With flexibility, the flexible printed circuit can be bonded on the inside door handle trim panel 2 compactly for no misjudgment attributed to interferences of electronic signals between a traditional PCB and a distant capacitive sensing element 5, no poor contact and better accuracy of capacitive sensing.

In another embodiment of the present application, the warning unit 7 further comprises each of a light warning portion 70 and a voice warning portion 72 or a combination thereof. In the present disclosure, the light warning portion 70 (the voice warning portion 72) enables default luminescence (default voice), which has been configured in the control unit 8 initially, according to a warning instruction.

In an embodiment of the present application, the control unit 8 receives warning information from a distance detection module 94 and/or a hazard warning light control module 96 inside an automotive system 9, sending a warning instruction based on the warning information. Accordingly, a car user who is leaving an automobile is reminded of a moving vehicle from behind through the capacitive sensing element 5 installed inside and further current status outside detected by the distance detection module 94 and/or the hazard warning light control module 96 of the automotive system 9 for no distraction about other vehicles from behind attributed to a car user's blind spot in advance and better safety of passengers. In the present disclosure, the distance detection module 94 comprises a blind spot detector 940 and an ultrasonic rangefinder 942.

Furthermore, in another embodiment of the present application, the control unit 8 sends a warning instruction to a hazard warning light control module 96 which is activated according to the warning instruction. The hazard warning light control module 96 warns a car user leaving an automobile of oncoming traffic for longer response time of drivers in the oncoming traffic (for example, slowing down or dodging an opened car door), no traffic accident of a car user leaving an automobile relative to other vehicles fast moving from behind and slowing down too late, and further an optimized warning function of the capacitive sensing car-door pre-opening warning device based on a flexible printed circuit 1.

In another embodiment of the present application, the control unit 8 is characteristic of a default speed standard configured inside; the control unit 8 receives car speed information from the speed detection module 98 of the automotive system 9 to disable the warning mode by verifying a car speed higher than the default speed standard or enable the warning mode by verifying a car speed lower than the default speed standard. Accordingly, the warning unit 7 in a moving vehicle is not mistakenly activated by a car user who keeps driving attentively and undistracted because of no unnecessary warnings giving rise to driving risks. In the embodiment, the default speed standard is set to between 6 and 8 km/hr. The default speed standard is the speed of a vehicle to be stopped for no traffic accident like a car door opened by a passenger inside a moving car and hit by other unprepared vehicles from behind.

In another embodiment, the control unit 8 enables or disables the warning mode optionally with a car speed higher than the default speed standard verified wherein a warning instruction of the warning mode for a car speed higher than the default speed standard enables the warning unit 7 but disables the hazard warning light control module 96. Comparatively, the control unit 8 enables the warning mode optionally with a car speed lower than the default speed standard verified wherein a warning instruction of the warning mode for a car speed lower than the default speed standard enables both the warning unit land the hazard warning light control module 96 simultaneously. The above configurations inform a driver, who is driving an automobile at a high speed, of any passenger's intentional action to get off the automobile and make the diver remind the passenger about any impermissible risky action in time because the hazard warning light control module 96 of the automotive system 9 in a vehicle moving at a high speed is not activated for no error information received by other car drivers nearby.

For most automobiles with their car doors locked during movements, the control unit 8 can receive information of a car door locked from the automotive system 9 for enabling or disabling the warning mode optionally or receive information of a car door unlocked from the automotive system 9 for enabling the warning mode in another embodiment of the present application. The above configurations make the warning unit 7 non-activated for a car door locked to prevent unnecessary warnings and promote safety of a car user driving an automobile.

Amid automobiles with different ways of unlocking, the warning unit 7 in some vehicle types with car doors to be unlocked manually can be configured as "disabled" when a car door is locked. For some vehicle types which will be unlocked with their car doors pulled out, the warning unit 7 is configured as "enabled" in the control unit 8 as required when a car door is locked.

What is claimed is:

1. A capacitive sensing car-door pre-opening warning device based on a flexible printed circuit, comprising:
    an inside door handle trim panel, which is mounted on the inner side of a car door opposite to a car door linkage of the automobile and designed to have a through hole as well as an accommodating space;
    an inside door handle subassembly, which has a portion penetrating the through hole and linking the car door linkage and another portion covered in the accommodating space;
    a flexible printed circuit, which has a surface mounted on one plane of the inside door handle trim panel opposite to the interior of the car door and/or installed on one plane of the inside door handle trim panel opposite to the accommodating space;
    a capacitive sensing element, which is mounted on the other surface of the flexible printed circuit and used to sense a variation of capacitance in at least the accommodating space;
    a capacitive-sensing processing circuit, which is designed on the flexible printed circuit, electrically connected with the capacitive sensing element, and used to process a variation of capacitance sensed by the capacitive sensing element for generation of a sensing capacitance;
    a warning unit, which is installed in the automobile; and
    a control unit, which is installed on the flexible printed circuit or inside the automobile, electrically connected with the capacitive-sensing processing circuit and the warning unit, and configured to have a warning mode and depends on the received sensing capacitance to enable the warning mode by which the warning unit is activated according to a warning instruction configured in the control unit.

2. A capacitive sensing car-door pre-opening warning device based on a flexible printed circuit as claimed in claim 1 wherein the warning unit further comprises:
    a light warning portion and/or a voice warning portion wherein the light warning portion (the voice warning portion) enables default luminescence (default voice) according to a warning instruction.

3. A capacitive sensing car-door pre-opening warning device based on a flexible printed circuit as claimed in claim 1 wherein the control unit is further used to:
    receive warning information from a distance detection module and/or a hazard warning light control module inside an automotive system and send a warning instruction based on the warning information.

4. A capacitive sensing car-door pre-opening warning device based on a flexible printed circuit as claimed in claim 3 wherein the distance detection module comprises a blind spot detector and an ultrasonic rangefinder.

5. A capacitive sensing car-door pre-opening warning device based on a flexible printed circuit as claimed in claim 3 wherein the control unit is further used to:
    send the warning instruction to the hazard warning light control module which is activated according to the warning instruction.

6. A capacitive sensing car-door pre-opening warning device based on a flexible printed circuit as claimed in claim 1 wherein the control unit is characteristic of a default speed standard configured inside and used to:
    receive car speed information from a speed detection module of the automotive system to enable or disable the warning mode optionally by verifying a car speed higher than the default speed standard;
    receive car speed information from a speed detection module of the automotive system to enable the warning mode by verifying a car speed lower than the default speed standard.

7. A capacitive sensing car-door pre-opening warning device based on a flexible printed circuit as claimed in claim 5 wherein the control unit is characteristic of a default speed standard configured inside and further used to:
    receive car speed information from a speed detection module of the automotive system to enable or disable the warning mode optionally by verifying a car speed higher than the default speed standard wherein the warning instruction activates the warning unit and deactivates the hazard warning light control module;
    receive car speed information from a speed detection module of the automotive system to enable the warning mode by verifying a car speed lower than the default speed standard wherein the warning instruction activates both the warning unit and the hazard warning light control module.

8. A capacitive sensing car-door pre-opening warning device based on a flexible printed circuit as claimed in claim 1 wherein the control unit is further used to:
    receive information of a car door locked from the automotive system for enabling or disabling the warning mode optionally;
    receive information of a car door unlocked from the automotive system for enabling the warning mode optionally.

9. A capacitive sensing car-door pre-opening warning device based on a flexible printed circuit as claimed in claim 1 wherein the flexible printed circuit, the capacitive sensing element and the capacitive-sensing processing circuit are formed integrally.

* * * * *